(12) United States Patent
Alcoe et al.

(10) Patent No.: US 7,186,590 B2
(45) Date of Patent: Mar. 6, 2007

(54) THERMALLY ENHANCED LID FOR MULTICHIP MODULES

(75) Inventors: David J. Alcoe, Vestal, NY (US);
William L. Brodsky, Binghamton, NY (US); Varaprasad V. Calmidi, Vestal, NY (US); Sanjeev B. Sathe, Binghamton, NY (US); Randall J. Stutzman, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 163 days.

(21) Appl. No.: 10/665,669

(22) Filed: Sep. 18, 2003

(65) Prior Publication Data

US 2004/0057214 A1     Mar. 25, 2004

Related U.S. Application Data

(62) Division of application No. 10/198,393, filed on Jul. 16, 2002, now Pat. No. 6,665,187.

(51) Int. Cl.
*H01L 21/44* (2006.01)
(52) U.S. Cl. .............. 438/122; 438/125; 257/704
(58) Field of Classification Search ........ 438/122–123, 438/125, 55; 257/704–707, 675, 717, 721–722; 361/704, 709, 711, 717, 719, 690–691; 165/104.33, 165/104.21
See application file for complete search history.

(56) References Cited

U.S. PATENT DOCUMENTS

| | | | | |
|---|---|---|---|---|
| 3,957,107 A | * | 5/1976 | Altoz et al. | 165/276 |
| 4,313,492 A | * | 2/1982 | Andros et al. | 165/104.26 |
| 4,547,424 A | * | 10/1985 | Suzuki | 428/316.6 |
| 4,612,978 A | | 9/1986 | Cutchaw | |
| 4,996,589 A | * | 2/1991 | Kajiwara et al. | 257/714 |
| 5,097,387 A | * | 3/1992 | Griffith | 361/699 |
| 5,179,500 A | | 1/1993 | Koubek et al. | |
| 5,198,889 A | * | 3/1993 | Hisano et al. | 257/678 |
| 5,216,580 A | | 6/1993 | Davidson et al. | |
| 5,325,265 A | | 6/1994 | Turlik et al. | |
| 5,704,416 A | | 1/1998 | Larson et al. | |
| 5,821,762 A | * | 10/1998 | Hamaguchi et al. | 324/754 |
| 5,880,524 A | * | 3/1999 | Xie | 257/704 |
| 5,915,463 A | | 6/1999 | Romero et al. | |
| 5,933,323 A | * | 8/1999 | Bhatia et al. | 361/700 |
| 6,085,831 A | | 7/2000 | DiGiacomo et al. | |
| 6,091,603 A | | 7/2000 | Daves et al. | |
| 6,133,631 A | * | 10/2000 | Belady | 257/714 |
| 6,166,908 A | * | 12/2000 | Samaras et al. | 361/700 |
| 6,212,074 B1 | * | 4/2001 | Gonsalves et al. | 361/717 |
| 6,269,866 B1 | * | 8/2001 | Yamamoto et al. | 165/104.33 |
| 6,292,369 B1 | * | 9/2001 | Daves et al. | 361/719 |
| 6,313,994 B1 | * | 11/2001 | Tantoush | 361/704 |

(Continued)

*Primary Examiner*—Thao X. Le
(74) *Attorney, Agent, or Firm*—Schmeiser, Olsen & Watts; William H. Steinberg

(57) ABSTRACT

An electronic package having one or more components comprising: a substrate having a first coefficient of thermal expansion; a lid attached to the substrate, the lid including a vapor chamber, the lid having a second coefficient of thermal expansion, the first coefficient of thermal expansion matched to the second coefficient of expansion; a thermal transfer medium in contact with a back surface of each component and an outer surface of a lower wall of the lid; and each component electrically connected to a top surface of the substrate.

20 Claims, 12 Drawing Sheets

U.S. PATENT DOCUMENTS

| | | | |
|---|---|---|---|
| 6,329,603 B1 * | 12/2001 | Japp et al. | 174/255 |
| 6,410,982 B1 * | 6/2002 | Brownell et al. | 257/714 |
| 6,490,160 B2 * | 12/2002 | Dibene et al. | 361/700 |
| 6,550,531 B1 * | 4/2003 | Searls et al. | 165/104.33 |
| 6,556,455 B2 * | 4/2003 | Dibene et al. | 361/785 |
| 6,590,409 B1 * | 7/2003 | Hsiung et al. | 324/765 |
| 6,637,506 B2 * | 10/2003 | Gektin et al. | 165/185 |
| 6,717,246 B2 * | 4/2004 | Budelman | 257/678 |
| 6,808,798 B2 * | 10/2004 | Tobita | 428/298.1 |
| 2002/0080584 A1 * | 6/2002 | Prasher et al. | 361/702 |
| 2002/0144804 A1 * | 10/2002 | Liang et al. | 165/104.33 |
| 2003/0024698 A1 * | 2/2003 | Bosak, III | 165/185 |
| 2003/0150604 A1 * | 8/2003 | Koning et al. | 165/185 |
| 2003/0155102 A1 * | 8/2003 | Garner | 165/80.3 |
| 2003/0171006 A1 * | 9/2003 | Getkin et al. | 438/795 |

* cited by examiner

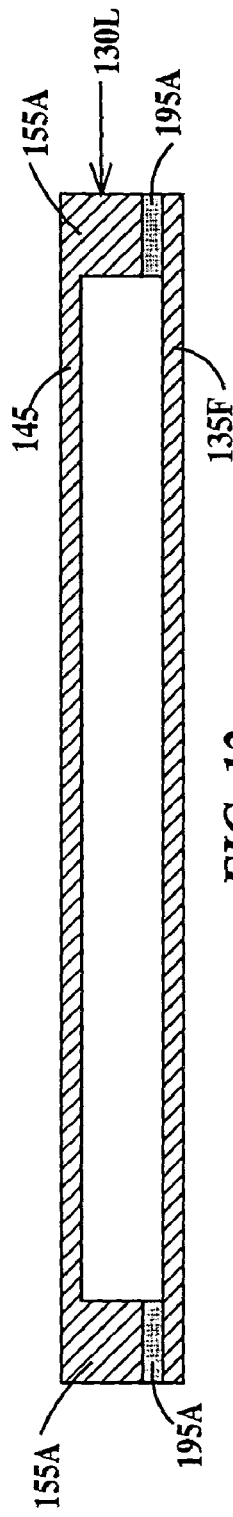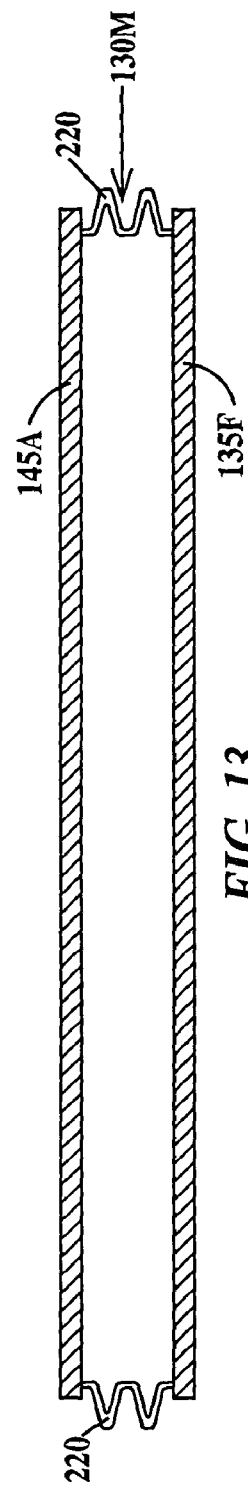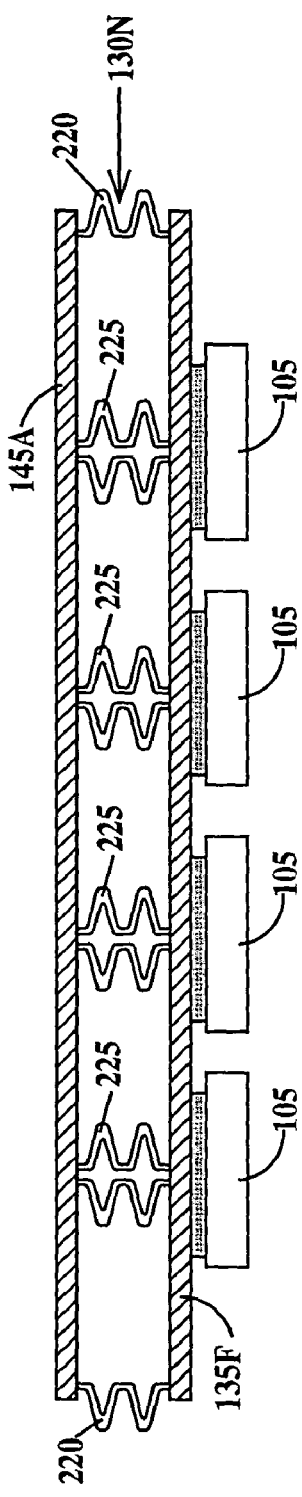

THERMALLY ENHANCED LID FOR MULTICHIP MODULES

This application is a divisional of Ser. No. 10/198,393; filed on Jul. 16, 2002 now U.S. Pat. No. 6,665,187.

FIELD OF THE INVENTION

The present invention relates to dissipating heat generated by integrated circuit modules; more specifically, it relates to an efficient and reduced stress package for integrated circuits.

BACKGROUND OF THE INVENTION

With the advent of multichip modules (MCMs), containing multiple integrated circuit (IC) chips each having many thousands of circuit elements, it has become possible to pack great numbers of electronic components together within a very small volume. As is well known, ICs generate significant amounts of heat during the course of their normal operation. Since most semiconductor or other solid state devices are sensitive to excessive temperatures, a solution to the problem of the generation of heat by IC chips in close proximity to one another in MCMs is of continuing concern to the industry.

A conventional approach to cooling components in electronic systems in which devices contained in MCMs are placed on printed circuit/wire boards or cards is to direct a stream of cooling air across the modules. Additionally, heat sinks may be attached to the module to enhance the effectiveness of the airflow.

Limitation in the cooling capacity of the simple airflow/heat sink approach to cooling has led to the use of another technique, which is a more advanced approach to cooling of card-mounted MCMs. This technique utilizes heat pipe technology. Heat pipes per se are of course, well known and heat pipes in the form of vapor chambers are becoming common. In the related art, there are also teachings of heat pipes/vapor chambers for dissipating the heat generated by electronic components mounted on cards. However, heat pipe/vapor chamber technology has several limitations when applied to MCMs. One limitation is the thermally induced package and especially chip stress caused by a mismatch in the coefficient of thermal expansion (CTE) between the heat pipe/vapor chamber and both the integrated circuit chips and the MCM module substrate. Another limitation is when very thin wall heat pipes/vapor chamber heat vapor chambers are used, the thin walls can flex making such vapor chambers un-suitable for use with land-grid array (LGA) modules which require pressure be maintained on the LGA connection.

Therefore, there is a need for an efficiently cooled MCM that employs vapor chamber cooling while minimizing CTE mismatch induced package and chip stress and is suitable for a wide range of MCM types.

SUMMARY OF THE INVENTION

A first aspect of the present invention is an electronic package having one or more components comprising: a substrate having a first coefficient of thermal expansion; a lid attached to the substrate, the lid including a vapor chamber, the lid having a second coefficient of thermal expansion, the first coefficient of thermal expansion matched to the second coefficient of expansion; a thermal transfer medium in contact with a back surface of each component and an outer surface of a lower wall of the lid; and each component electrically connected to a top surface of the substrate.

A second aspect of the present invention is a method for dissipating heat from an electronic package having one or more components comprising: providing a substrate having a first coefficient of thermal expansion; attaching a lid to the substrate, the lid including a vapor chamber, the lid having a second coefficient of thermal expansion; matching the first coefficient of thermal expansion matched to the second coefficient of expansion; providing a thermal transfer medium in contact with a back surface of each component and an outer surface of a lower wall of the lid; and electrically connecting each component to a top surface of the substrate.

A third aspect of the present invention is an 18. An electronic package having one or more components comprising: a substrate having a first coefficient of thermal expansion; a lid attached to the substrate, the lid including a vapor chamber, the lid having a second coefficient of thermal expansion, the first coefficient of thermal expansion between about 25% to about 700% of the second coefficient of expansion; a thermal transfer medium in contact with a back surface of each component and an outer surface of a lower wall of the lid; and each component electrically connected to a top surface of the substrate.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 12 and 13 are cross-sectional views of two alternative lid constructions that may be used in conjunction with the third, fourth, seventh and eighth embodiments of the present invention;

FIG. 14 is a cross-sectional view of a further lid construction that may be used in conjunction with the seventh and eighth embodiments of the present invention;

DETAILED DESCRIPTION OF THE INVENTION

For the purposes of the present disclosure, the terms printed circuit board (PCB) and printed wire board (PWB) are equivalent terms. The terms "in contact" and "contacting" indicate mechanical and thermal contact.

Figure 1:
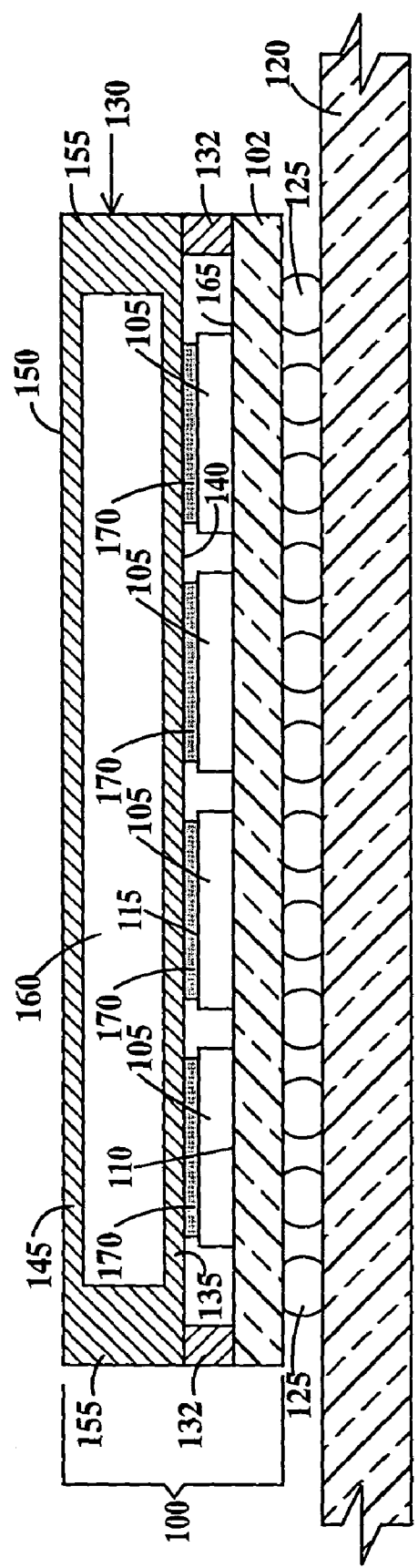
FIG. 1 is a cross-sectional view of a first embodiment of a multichip module mounted on a printed circuit board having a lid according to the present invention.

FIG. 1 is a cross-sectional view of a first embodiment of a multichip module mounted on a PCB having a lid according to the present invention. In FIG. 1, MCM 100 includes a substrate 102 having a multiplicity of components 105 mounted thereto, each component having a front surface 110 and a back surface 115. MCM 100 is mounted to a PCB 120 by a multiplicity of solder balls 125. Substrate 102 may be a single or multi-level substrate and may be ceramic, fiberglass or polymer based. MCM 100 also includes a lid 130. Lid 130 is mounted to substrate 102 by lid support 132 connecting the periphery of lid 130 to the periphery of substrate 102. Lid support 132 may be fabricated from the same material as lid 130 and may be integral with the lid. Alternatively, lid support 132 may be fabricated from a material different from that of lid 130. Lid support 132 may provide a hermetic seal between lid 130 and substrate 102.

Lid 130 includes a lower wall 135 having an outer surface 140, an upper wall 145 having an outer surface 150 and sidewalls 155 defining a vapor chamber 160. Vapor chamber 160 contains a heat transfer fluid such as, inter alia, water, freon or glycol. Front sides 110 of components 105 are electrically connected to a top surface 165 of substrate 102. Components 105 may be flip chip, wire-bonded or soldered to substrate 102. A thermal transfer medium 170 is in contact with back surfaces 115 of components 105 and outer surface 140 of lower wall 135 of lid 130 to enable thermal contact, mechanical restraint and pressure support over the contacting region. Thermal transfer medium 170 enables heat generated by the operation of components 105 to be efficiently transferred to lid 130.

Because of the excellent heat transfer capability afforded to lid 130 by vapor chamber 160, the lid may be fabricated from many different materials including but not limited to metals such as aluminum, copper, nickel, gold or Invar and other materials such as plastics, ceramics and composites. Because of the wide range of materials available, lid 130 may fabricated from a material having a CTE matched to (between about 25% to 700% of the coefficient of thermal expansion) substrate 102 or from the same material as the substrate. For example, if MCM 100 is a HyperBGA™ International Business Machine Corp., Armonk, N.Y., in which substrate 102 is a polytetraflouroethylene (PTFE) based material having a CTE of about 10–12 ppm/° C. module, then lid 130 may be fabricated from an aluminum-silicon carbide composite having a CTE of about 10 ppm/° C. In order to place the least amount of thermally induced mechanical stress on components 105, lower wall 135 of lid 130 may be fabricated to be thin. For example, if lid 130 were fabricated from copper (CTE about 17 ppm/° C.) and components 105 were fabricated from single-crystal silicon (CTE about 3 ppm/° C.) a thin wall would reduce the stress generated by any mismatch of CTE because the wall could flex. In one example, lower wall 135 is about 250 microns or less in thickness.

Thermal transfer medium 170 may be thermal adhesive, thermal grease, thermal-conductive pads, phase change or other materials known in the art.

While MCM 100 has been illustrated in FIG. 1 and described above as a ball grid array (BGA) module, MCM 100 may be pin grid array (PGA) module.

Figure 2:
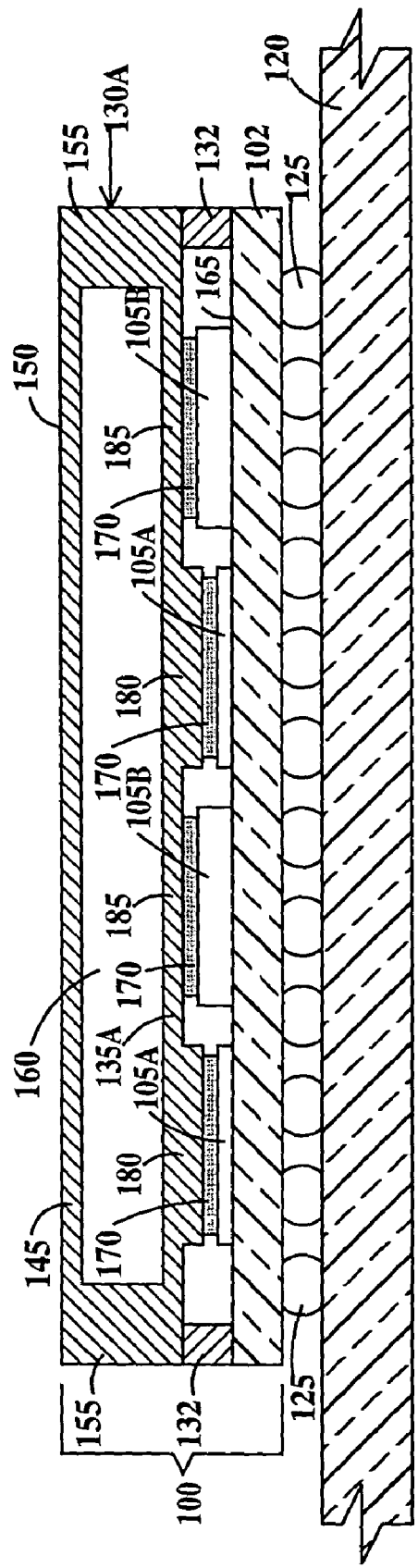
FIG. 2 is a cross-sectional view of a second embodiment of a multichip module mounted on a printed circuit board having a lid according to the present invention.

FIG. 2 is a cross-sectional view of a second embodiment of a multichip module mounted on a printed circuit board having a lid according to the present invention. In FIG. 2, lower wall 135A of lid 130A has thick protruding regions 180 for maintaining the same or equivalent contact pressure, thermal contact and mechanical restraint on thin components 105A as is maintained by thin regions 185 on thick components 105B. Otherwise, lid 130A is identical to lid 130 illustrated in FIG. 1 and described above. While components having two different thicknesses are illustrated in FIG. 2, the second embodiment of the present invention may be extended to use with components having three of more thicknesses that are different. For example, components may be manufactured from semiconductor wafers fabricated from different thickness (i.e 200 and 300 millimeter diameter wafers) or from devices requiring different final thicknesses (i.e. logic, memory and passive devices).

Figure 3:
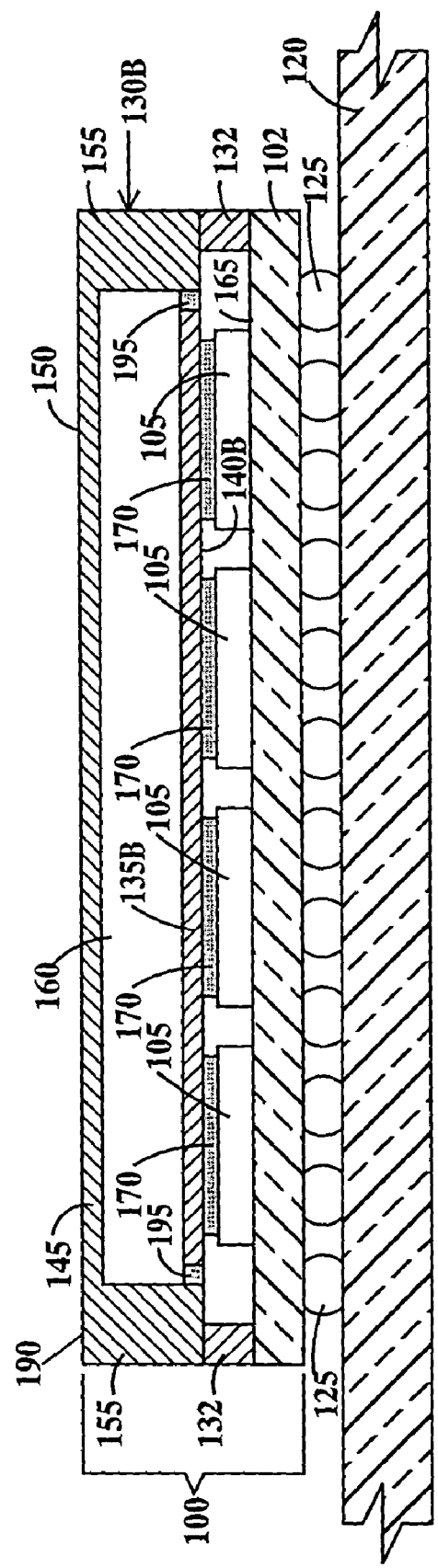
FIG. 3 is a cross-sectional view of a third embodiment of a multichip module mounted on a printed circuit board having a lid according to the present invention.

FIG. 3 is a cross-sectional view of a third embodiment of a multichip module mounted on a printed circuit board having a lid according to the present invention. In FIG. 3, lid 130B includes a separate lower wall 135B having an outer surface 140B and a body 190 having an upper wall 145 having an outer surface 150 and sidewalls 155 defining a vapor chamber 160. Lower wall 135B is attached to sidewalls 155 by any suitable adhesive 195, though a resilient adhesive is desirable if the CTE of wall 135B is significantly different from the CTE of body 190. Lid 130B and lower wall 135B may be fabricated from many different materials including but not limited to metals such as aluminum, copper or Invar, plastics, ceramics and composites. Body 190 and lower wall 135B may be fabricated from the same or different materials. Body 190 may fabricated from a material having a coefficient of CTE matched to (between about 25% to 700%) the coefficient of thermal expansion of substrate 120 while lower wall 135B may be fabricated from a material having a CTE matched to (between about 50% to 700%) the coefficient of thermal expansion of the material of components 105. For example, if MCM 100 is a Hyper-BGA™ International Business Machine Corp., Armonk, N.Y., (CTE of about 10–12 ppm/° C.) and components 105 are single-crystal silicon (CTE of about 3 ppm/° C.), then body 190 may be fabricated from an aluminum-silicon carbide composite (CTE of about 10 ppm/° C.) and lower wall 135B may be fabricated from glass ceramic (CTE of about 3 ppm/° C.), silicon (CTE of about 3 ppm/° C.) or alumina (CTE of about 6 ppm/° C.). In order to place the least amount of thermally induced mechanical stress on components 105, lower wall 135B may be fabricated to be thin. For example, lower wall 135B were fabricated from copper (CTE about 17 ppm/° C.) and components 105 were fabricated from single-crystal silicon (CTE and 3 ppm/° C.)

a thin wall would reduce the stress generated by the mismatch of CTE because the wall could stretch and flex. In one example, lower wall 135B is about 250 microns or less in thickness.

Lid support 132 may be fabricated from the same or a different material as lid 130B and may be integral with the lid. Lid support 132 may provide a hermetic seal between lid 130B and substrate 102.

Figure 4:
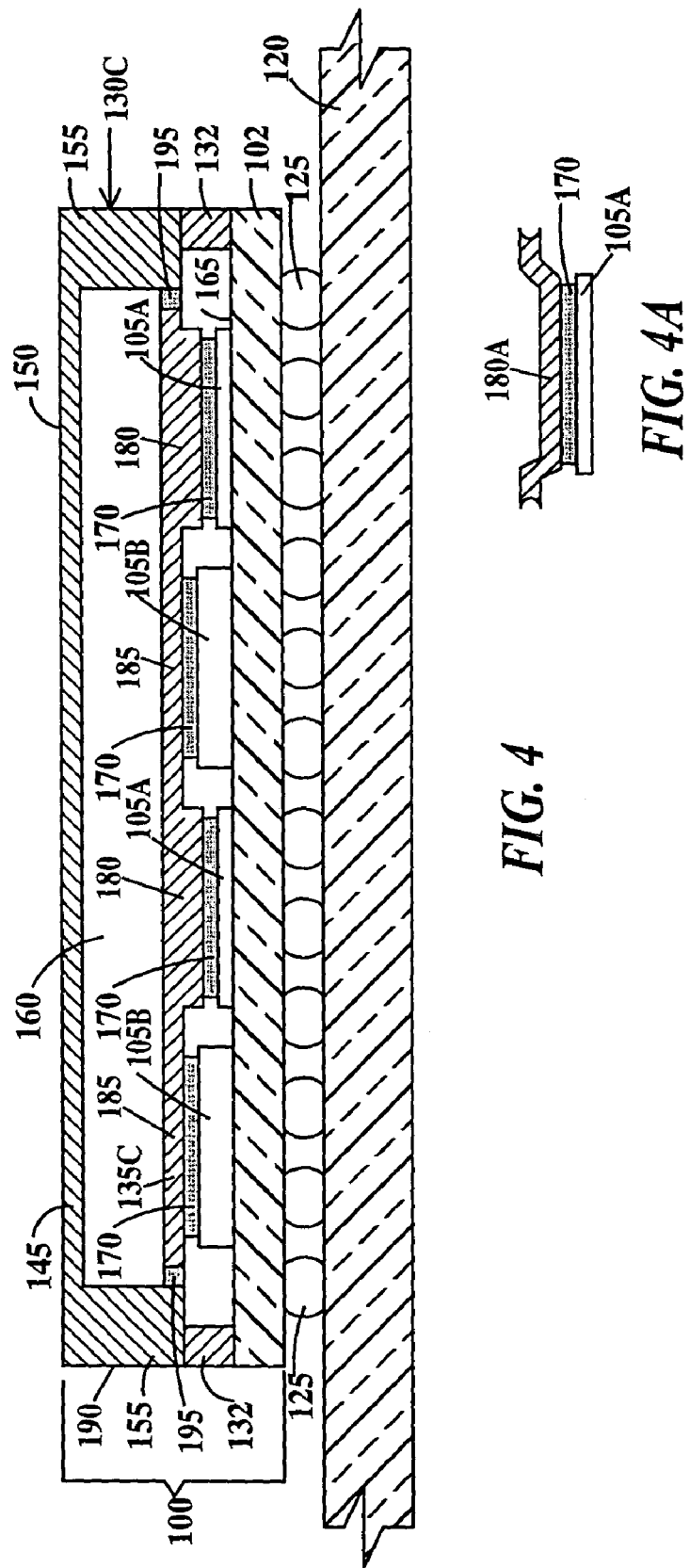
FIG. 4 is a cross-sectional view of a fourth embodiment of a multichip module mounted on a printed circuit board having a lid according to the present invention.

FIG. 4 is a cross-sectional view of a fourth embodiment of a multichip module mounted on a printed circuit board having a lid according to the present invention. In FIG. 4, lower wall 135C has protruding thick regions 180 for maintaining equivalent contact pressure on thin components 105A as is maintained by thin regions 185 on thick components 105B. Otherwise, lid 130C is identical to lid 130B illustrated in FIG. 3 and described above. While components having two different thicknesses are illustrated in FIG. 4, the fourth embodiment of the present invention may be extended to use with components having three of more thicknesses that are different. FIG. 4A provides an alternative cross-section to thick region 180 of lower wall 135C (see FIG. 4). In FIG. 4A, wall thickness of region 180A is the same as in thin region 185 (see FIG. 4) but regions 180A are deflected toward thin components 105A (by stamping or molding) such that contact is maintained between thermal transfer medium 170 and thin components 105A while maintaining a thin wall.

Figure 5:
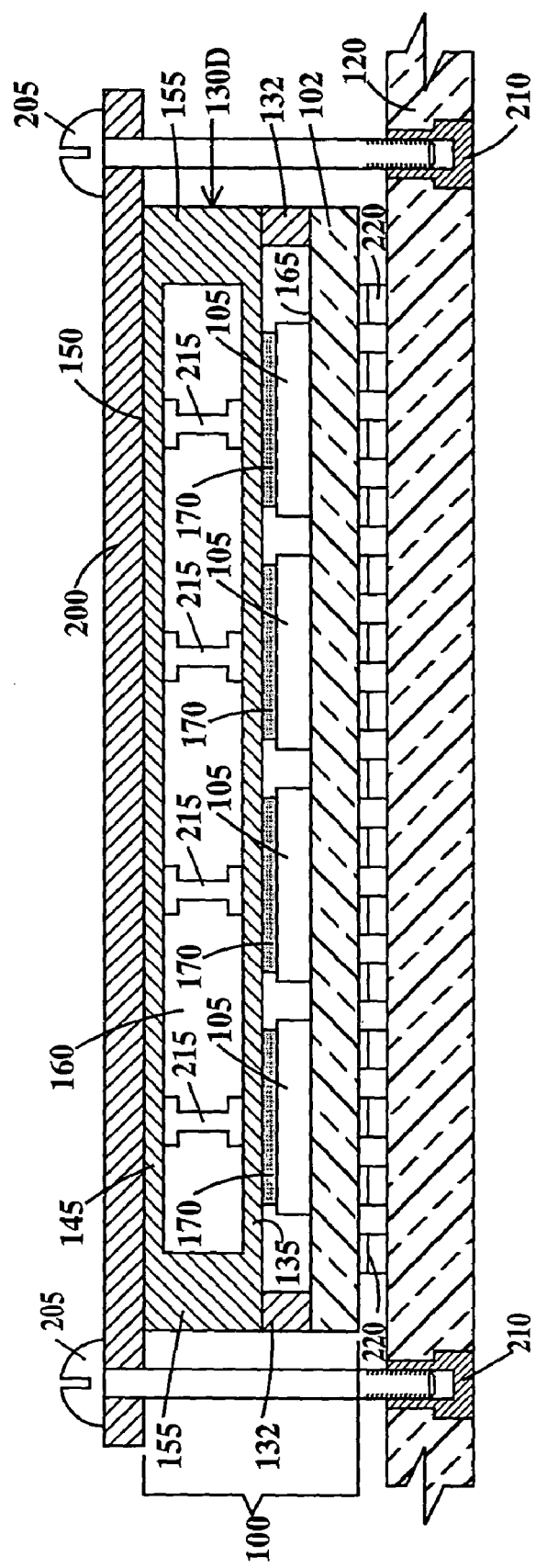
FIG. 5 is a cross-sectional view of a fifth embodiment of a multichip module mounted on a printed circuit board having a lid according to the present invention.

FIG. 5 is a cross-sectional view of a fifth embodiment of a multichip module mounted on a printed circuit board having a lid according to the present invention. The fifth embodiment is similar to the first embodiment except that flexural limitations caused in the case of an extremely flexible lower wall 135 are overcome in the fifth embodiment. In FIG. 5, a spreader plate 200 contacting outer surface 150 of lid 130D secures MCM 100 to PCB 120 via fasteners 205. Fasteners 205 are illustrated in FIG. 5 as screws engaging threaded inserts 210 in PCB 120, but other suitable fastening means may be used, such as spring clips or rivets.

Within vapor chamber 160 are supports 215 which, under pressure, contact upper wall 145 and lower wall 135. Supports 215 are aligned over components 105. Optionally, some or all of supports 215 may be aligned over some or all of components 105 and prevent excessive flexure and buckling of lower wall 135. Supports 215 spread the pressure applied to lid 130D by spreader plate 200 evenly to each component 105. Instead of solder balls 125 (see FIG. 1) Land Grid Array (LGA) connections 220 are illustrated between substrate 102 and PCB 120. Since LGA connections 220 are asperity contact connections, generally some degree of pressure must be maintained on the connection to ensure good electrical conductivity. Supports 215 may be fabricated from the same material as lid 130 or a from different material.

While MCM 100 has been illustrated in FIG. 5 and described above as a LGA module, MCM 100 may be BGA or a PGA module.

Figure 6:
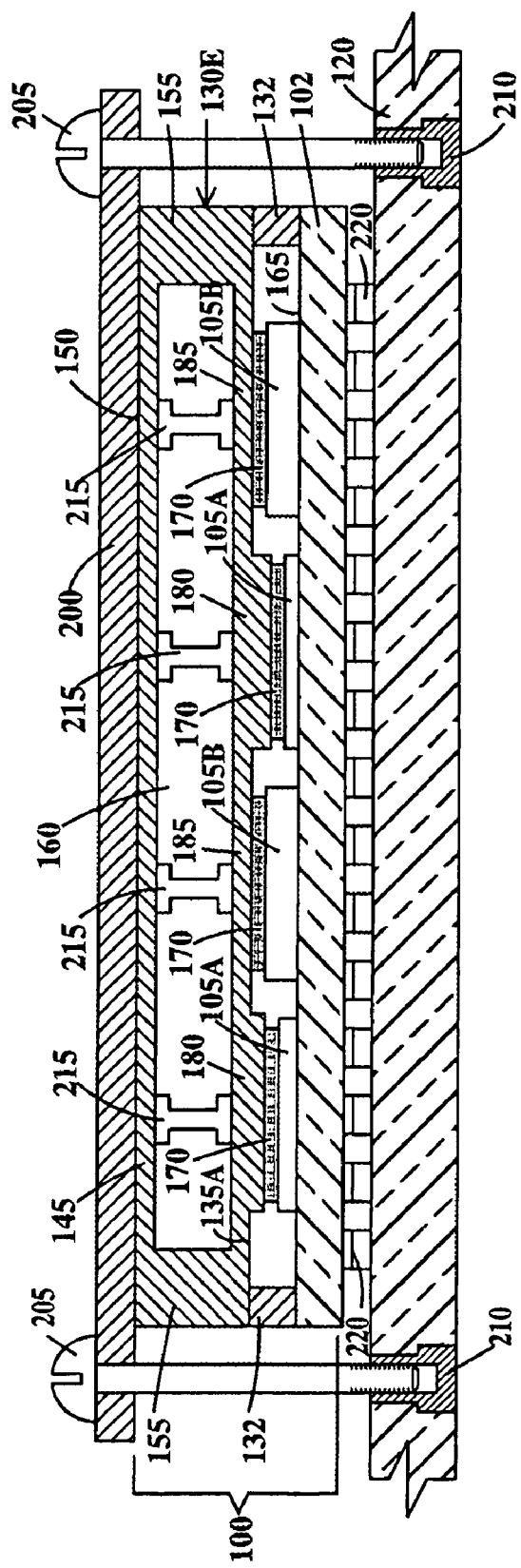
FIG. 6 is a cross-sectional view of a sixth embodiment of a multichip module mounted on a printed circuit board having a lid according to the present invention.

FIG. 6 is a cross-sectional view of a sixth embodiment of a multichip module mounted on a printed circuit board having a lid according to the present invention. In FIG. 6, lower wall 135A of lid 130E has thick regions 180 for maintaining equivalent contact pressure on thin components 105A as is maintained by thin regions 185 on thick components 105B. Otherwise, lid 130E is identical to lid 130D illustrated in FIG. 5 and described above. While components having two different thicknesses are illustrated in FIG. 6, the second embodiment of the present invention may be extended to use with components having three of more thicknesses that are different.

Figure 7:
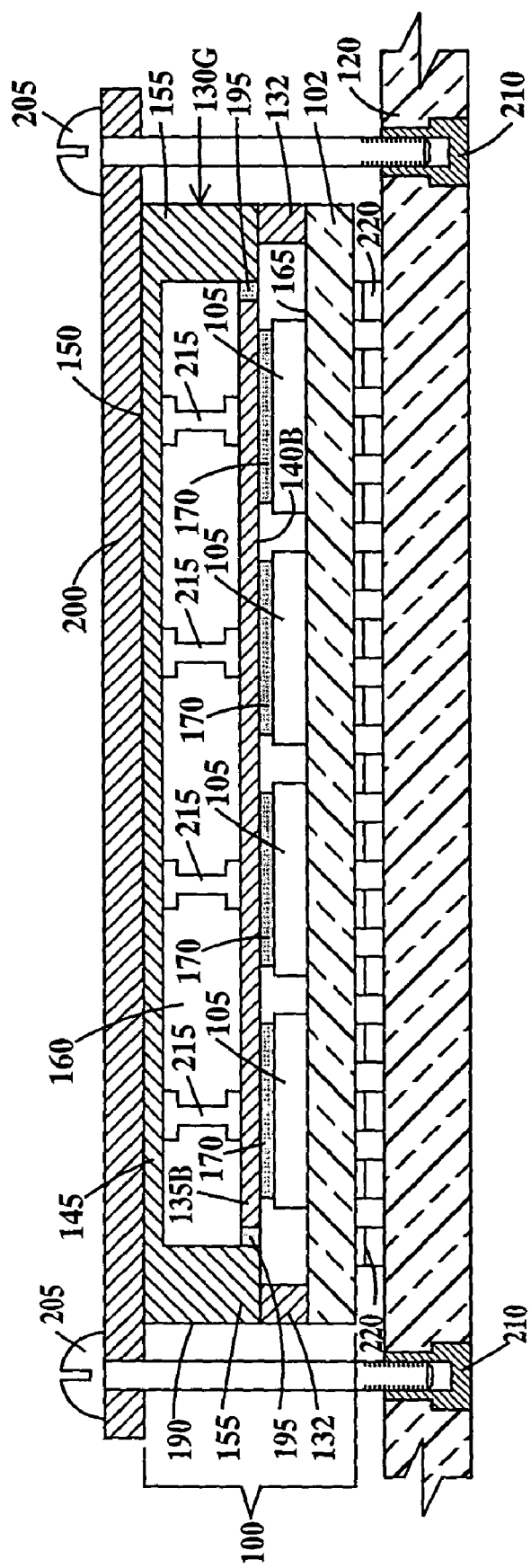
FIG. 7 is a cross-sectional view of a seventh embodiment of a multichip module mounted on a printed circuit board having a lid according to the present invention.

FIG. 7 is a cross-sectional view of a seventh embodiment of a multichip module mounted on a printed circuit board having a lid according to the present invention. In FIG. 7, lid 130G includes a separate lower wall 135B having an outer surface 140B and a body 190 having an upper wall 145 having an outer surface 150 and sidewalls 155 defining a vapor chamber 160. Lower wall 135B is attached to sidewalls 155 by any suitable adhesive 195, though a resilient adhesive is desirable if the CTE of wall 135B is significantly different from the CTE of body 190. Lid 130G and lower wall 135B may be fabricated from many different materials including but not limited to metals such as aluminum, copper or Invar, plastics, ceramics and composites. Body 190 may fabricated from a material having a coefficient of CTE matched to (between about 25% to 700%) the coefficient of thermal expansion of substrate 102 while lower wall 135B may be fabricated from a material having a CTE matched to (between about 50% to 700%) the coefficient of thermal expansion of the material of components 105.

Within vapor chamber 160 are supports 215 contacting upper wall 145 and lower wall 135B. Supports 215 are aligned over components 105. Supports 215 spread the pressure applied to lid 130G by spreader plate 200 evenly to each component 105. Lid support 132 and supports 215 may be fabricated from the same material or a different material as body 190.

Figure 8:
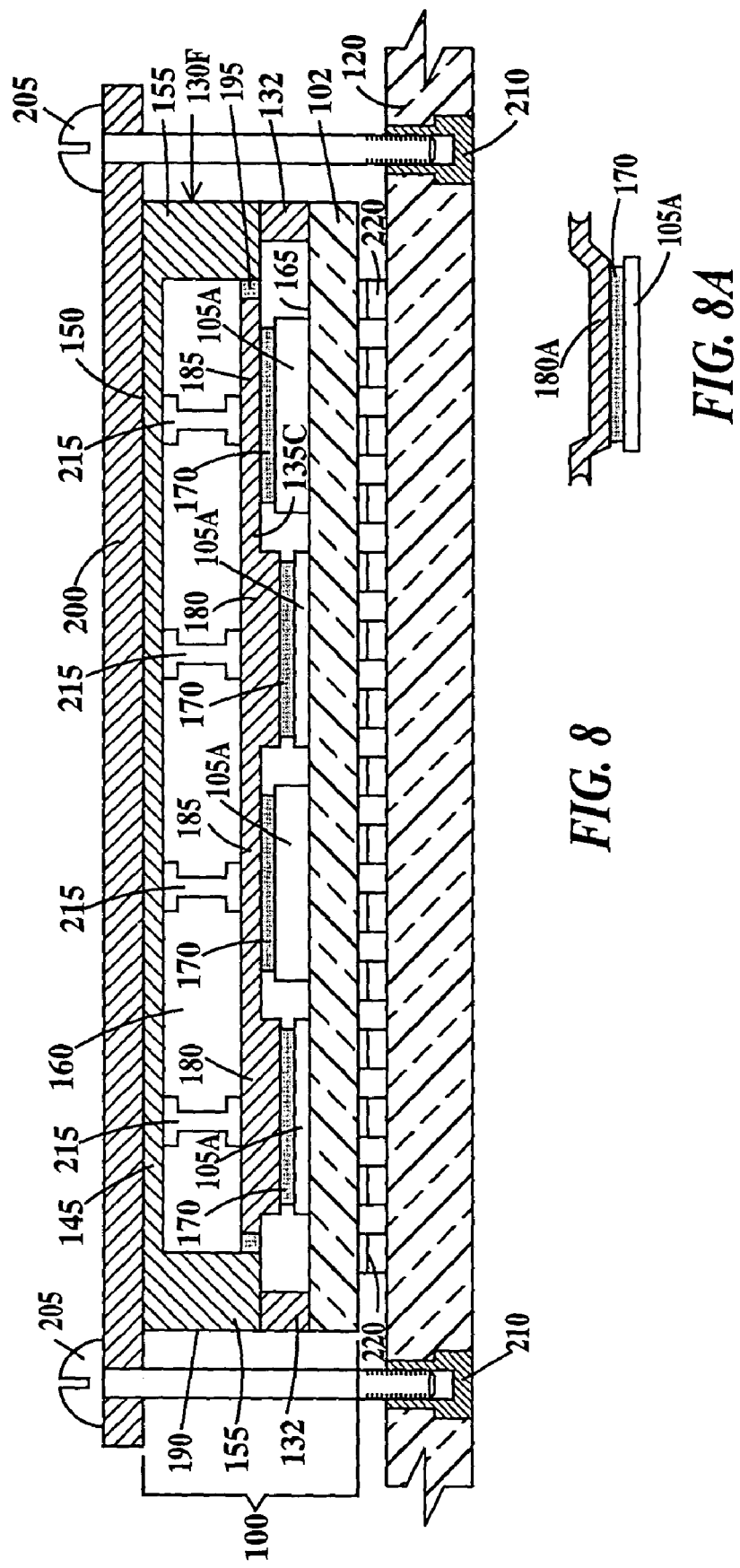
FIG. 8 is a cross-sectional view of an eighth embodiment of a multichip module mounted on a printed circuit board having a lid according to the present invention.

FIG. 8 is a cross-sectional view of an eighth embodiment of a multichip module mounted on a printed circuit board having a lid 130F according to the present invention. In FIG. 8, lower wall 135C has thick regions 180 for maintaining equivalent contact pressure on thin components 105A as is maintained by thin regions 185 on thick components 105B. Otherwise, lid 130F is identical to lid 130G illustrated in FIG. 7 and described above. While components having two different thicknesses are illustrated in FIG. 8, the second embodiment of the present invention may be extended to use with components having three of more thicknesses that are different. FIG. 8A provides an alternative cross-section to thick region 180 of lower wall 135C (see FIG. 8). In FIG. 8A, wall thickness of region 180A is the same as in thin region 185 (see FIG. 8) but region 180A is deflected toward thin components 105A (by stamping or molding) such that contact is maintained to thin components 105B while maintaining a thin wall.

Figure 9:
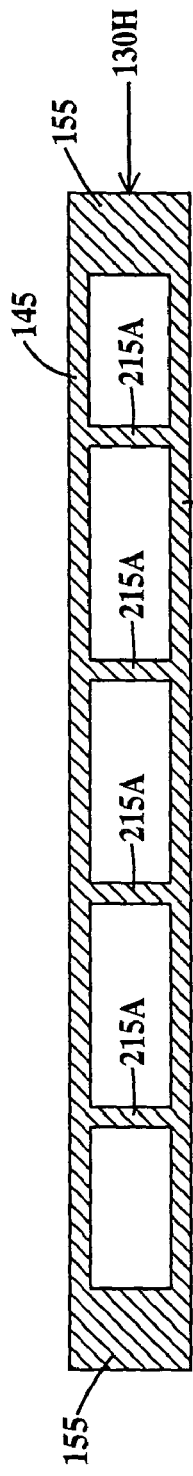
FIG. 9 is a cross-sectional view of an alternative lid construction that may be used in conjunction with the fifth and sixth embodiments of the present invention.

FIG. 9 is a cross-sectional view of an alternative lid construction that may be used in conjunction with the fifth and sixth embodiments of the present invention. In FIG. 9, a lid 130H includes integral lower wall 135, integral upper wall 145 and integral sidewalls 155. Integral internal supports 215 join upper wall 145 and lower wall 135.

Figure 10:
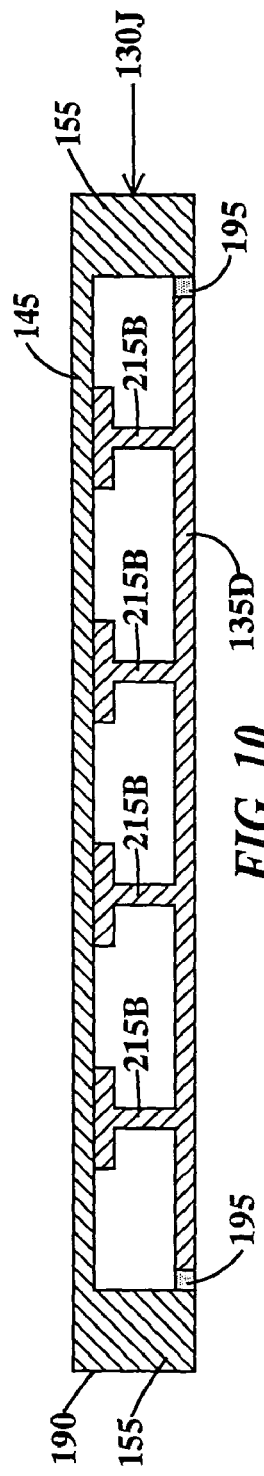
FIGS. 10 and 11 are cross-sectional views of two alternative lid constructions that may be used in conjunction with the seventh and eighth embodiments of the present invention.
Figure 11:
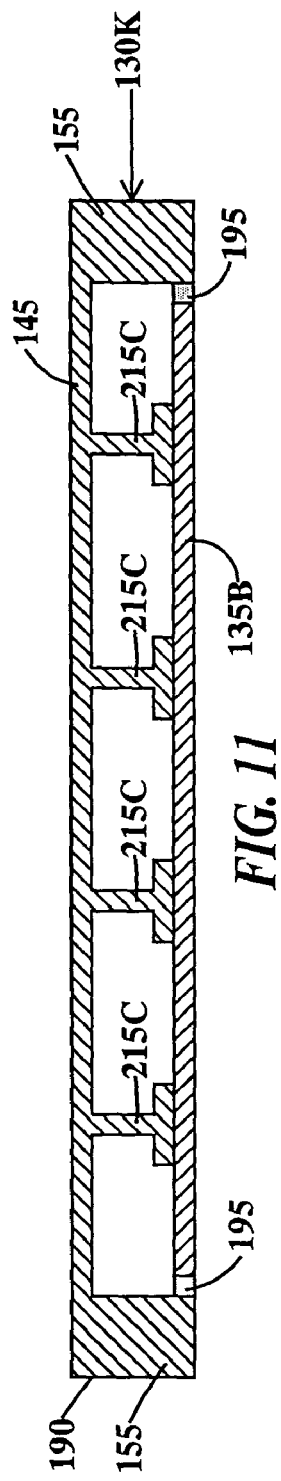

FIGS. 10 and 11 are cross-sectional views of two alternative lid constructions that may be used in conjunction with the seventh and eighth embodiments of the present invention. In FIG. 10, a lid 130J includes a separate lower wall 135D and body 190 having an integral upper wall 145 and integral sidewalls 155. Supports 215 are integral with lower wall 135D and contact upper wall 145. Lower wall 135D is joined to sidewalls 155 by adhesive 195. In FIG. 11, a lid 130K includes a separate lower wall 135B and a body 190A having integral upper wall 145, integral sidewalls 155 and integral supports 215C. Supports 215C contact lower wall 135B. Lower wall 135B is joined to sidewalls 155 by adhesive 195.

FIGS. 12 and 13 are cross-sectional views of two alternative lid constructions that may be used in conjunction with the third, fourth, seventh and eighth embodiments of the present invention. In FIG. 12, a lid 130L includes a separate lower wall 135F, a body 190B having an integral upper wall 145 and integral sidewalls 155A. Lower wall 135F is joined to sidewalls 155A by adhesive 195A. In FIG. 13, a lid 130M includes a separate lower wall 135F and a separate upper wall 145A connected along their respective periphery by a bellows 220. Internal supports (not shown) as illustrated in FIGS. 10 and 11 and described supra, may be used as well.

FIG. 14 is a cross-sectional view of a further lid construction that may be used in conjunction with the seventh and eighth embodiments of the present invention. In FIG. 14, a lid 130N includes separate lower wall 135F and separate upper wall 145A connected along their respective periphery by bellows 220. A plurality of internal bellows 225 contact upper wall 145A and lower wall 135F. Each internal bellows 225 is aligned over a corresponding component 105.

Figure 16:
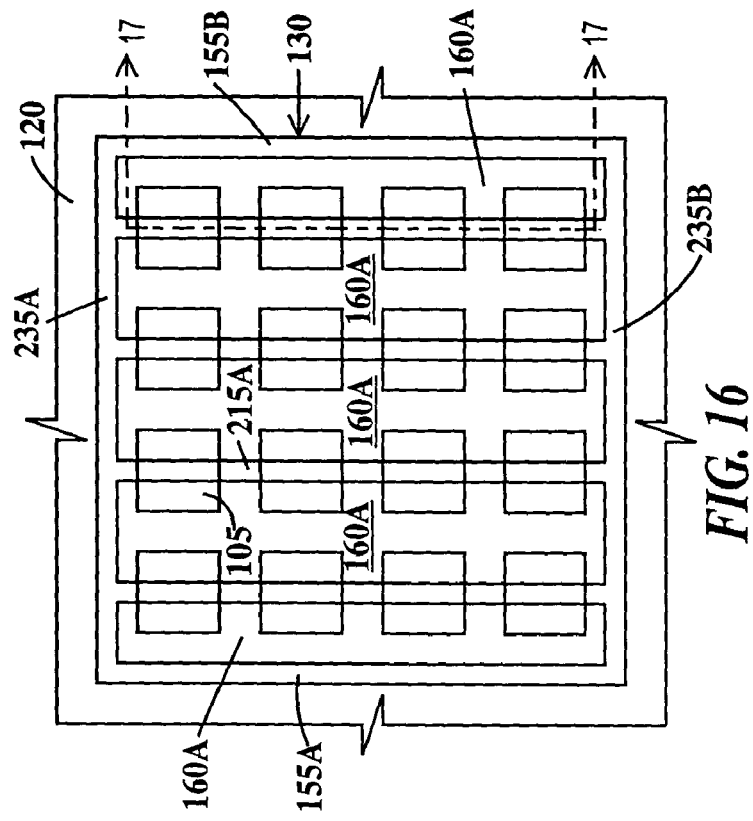
FIGS. 15 and 16 are plan views of two alternative lid layouts of that may be used in conjunction with the fifth, sixth, seventh and eighth embodiments of the present invention.
Figure 15:
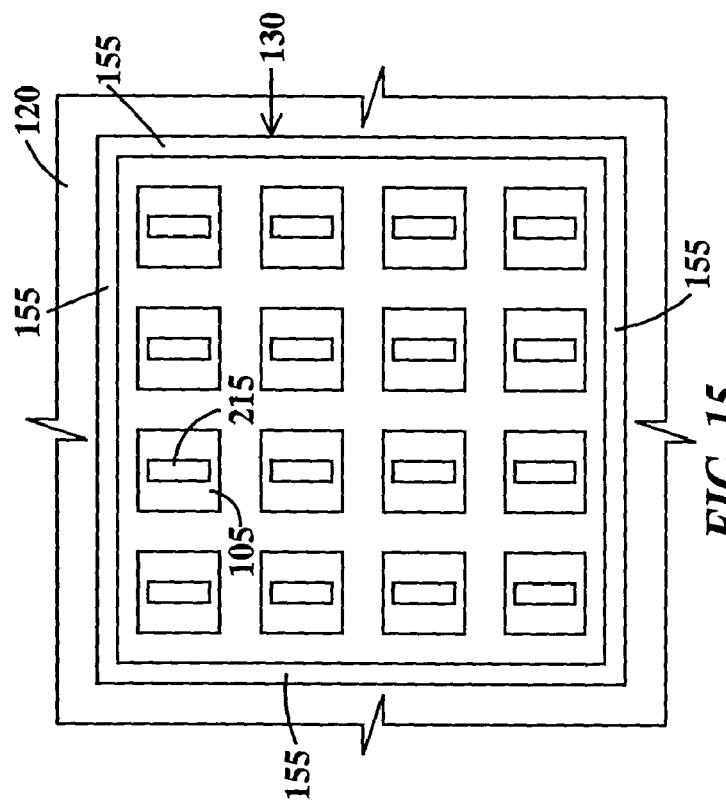

FIGS. 15 and 16 are plan views of two alternative lid layouts of that may be used in conjunction with the fifth, sixth, seventh and eighth embodiments of the present invention. In FIG. 15, lid 130 includes sidewalls 155 enclosing vapor chamber 160, and a plurality of separate supports 215. Each support 215 is aligned over a corresponding component 105. In FIG. 16, lid 130 includes a first pair of opposite facing sidewalls 155A and 155B, a second set of opposite facing sidewalls 235A and 235B, and a set of elongated supports 215A ruining between sidewalls 235A and 235B. The aforementioned sidewalls of lid 130 and supports 215A enclose each sub-vapor chamber 160A. Supports 215A create a set of sub-vapor chambers 160A. Each support 215A is aligned over multiple components 105.

Figure 17:
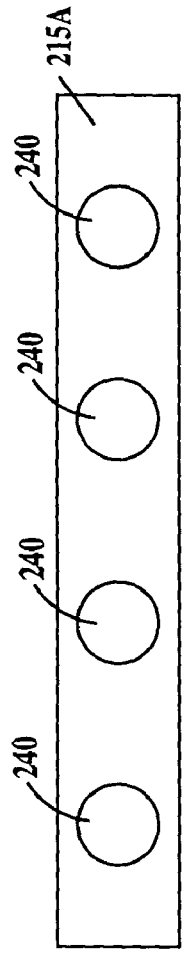
FIG. 17 is a cross-section view through section 17—17 of FIG. 16.

FIG. 17 is a cross-section view through section 17—17 of FIG. 16. In FIG. 17, support 215A optionally includes a plurality of holes 240. Holes 240 interconnect sub-vapor chambers 160A (see FIG. 16) to each other.

Figure 18:
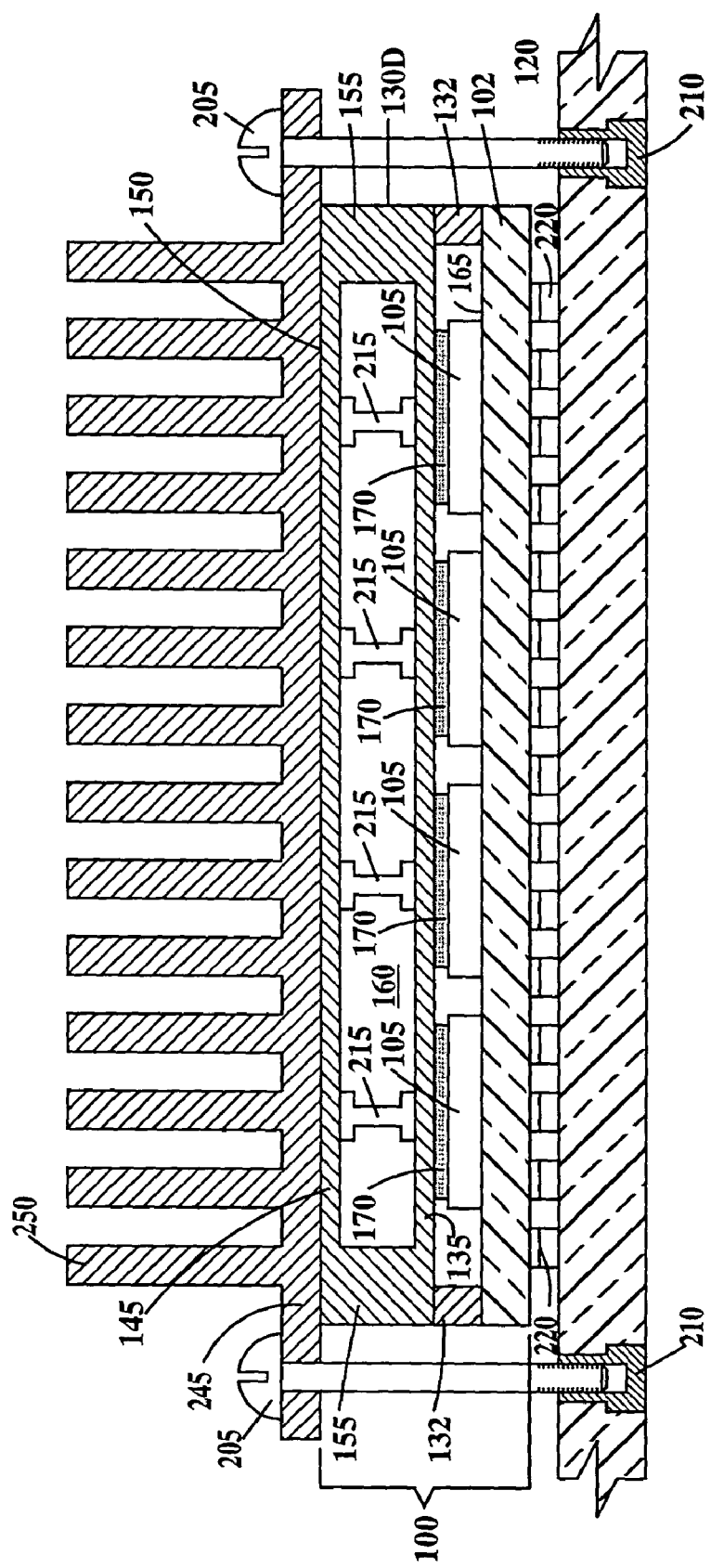
FIG. 18 is a cross-sectional of a lid with an attached heat sink according to the present invention.

FIG. 18 is a cross-sectional of a lid with an attached heat sink according to the present invention. In FIG. 18, spreader plate 200 (see FIG. 5) is replaced with a heat sink 245 having a plurality of vertical fins 250. Heat sink 245 may be formed from aluminum, copper, beryllium, white metal or any other suitable material with high heat conductivity.

Heat sink 245 may be fabricated from a material having a CTE matched to (between about 25% to 700%) the CTE of lid 130D or upper wall 145 in the case of lower wall 135 being a separate piece of lid 130D as illustrated, for example, in FIG. 7 and described supra. Additionally, lower wall 135 may be fabricated from a material having a CTE matched to (between about 50% to 700%) of the CTE of components 105 in the case of lower wall 135 being a separate piece of lid 130D.

Alternatively, for a one piece lid 130D as illustrated, the materials of heat sink 245 and lid 130D may be chosen such that the CTE of the heat sink is matched to (between about 25% to 700%) the CTE of the lid and the CTE of the lid is matched to (between about 50% to 700%) the CTE of components 105.

Thus, an efficiently cooled MCM that employs vapor chamber cooling while minimizing CTE mismatch induced package and chip stress and is suitable for a wide range of component sizes, thicknesses functions and MCM types has been described.

The description of the embodiments of the present invention is given above for the understanding of the present invention. It will be understood that the invention is not limited to the particular embodiments described herein, but is capable of various modifications, rearrangements, substitutions and combinations as will now become apparent to those skilled in the art without departing from the scope of the invention. For example, a single chip module (SCM) may be substituted for the MCM illustrated. Further, internal vapor chamber supports may be used in MCMs without spreader plates and spreader plates and heat sinks may be mounted to lids not having internal vapor chamber supports. Therefore, it is intended that the following claims cover all such modifications and changes as fall within the true spirit and scope of the invention.

What is claimed is:

1. A method for dissipating heat from an electronic package having one or more components, comprising:
   mounting each of said one or more components to a top surface of a substrate and electrically connecting each of said one or more components to said substrate, said substrate having a first coefficient of thermal expansion;
   attaching a bottom surface of a separately formed peripheral lid support to a periphery of a top surface of said substrate, said peripheral lid support having sidewalls defining a cavity open at a top surface and said bottom surface of said peripheral lid support;
   attaching said top surface of said peripheral lid support to only a bottom surface of a peripheral sidewall of a lid, said peripheral sidewall integrally formed only with and around a periphery of a top wall of said lid, said lid including a separately formed bottom wall positioned inside and sealed to inside surfaces of said peripheral sidewall, said top wall, peripheral sidewall and bottom wall of said lid defining a vapor chamber, said vapor chamber containing a heat transfer fluid, said top wall and said peripheral sidewall of said lid having a second coefficient of thermal expansion and said bottom wall of said lid having a third coefficient of thermal expansion, said first coefficient of expansion about equal to said second coefficient of thermal expansion; and
   placing a solid thermal transfer medium in direct physical contact with a back surface of each of said one or more components and in direct physical contact with an outer surface of said bottom wall of said lid.

2. The method of claim 1, wherein each said one or more components has a fourth coefficient of thermal expansion and said third coefficient of thermal expansion is about equal to said fourth coefficient of thermal expansion and said second coefficient of thermal expansion is different from said third coefficient of thermal expansion.

3. The method of claim 1, wherein each said one or more components has a fourth coefficient of thermal expansion and said third coefficient of thermal expansion is between about 50% to about 700% of said fourth coefficient of thermal expansion and said second coefficient of thermal expansion is different from said third coefficient of thermal expansion.

4. The method of claim 1, further including:
   mounting a heat sink having a fifth coefficient of thermal expansion to an outer surface of said top wall of said lid, said fifth coefficient of expansion about equal to said second coefficient of thermal expansion.

5. The method of claim 1, further including:
   mounting a heat sink having a fifth coefficient of thermal expansion to an outer surface of said top wall of said lid, said fifth coefficient of expansion between about 25% and about 700% of said second coefficient of thermal expansion.

6. The method of claim 1, wherein said bottom wall of said lid has protruding first regions for maintaining equivalent contact with said thermal transfer medium on thin components of said one or more components as is maintained by second non-protruding regions on thick components of said one or more components, said first regions thicker than said second regions.

7. The method of claim 1, wherein said bottom wall of said lid has protruding first regions for maintaining equivalent contact with said thermal transfer medium on thin components of said one or more components as is maintained by second non-protruding regions on thick components of said one or more components, said first regions and said second regions having a same thickness.

8. The method of claim 1, said lid further including supports completely within said vapor chamber, each support having a vertical member extending completely between said top wall of said lid and said bottom wall of said lid, each vertical member perpendicular to said top and bottom walls and each and every vertical member aligned over a different and only one component of said one or more components or aligned over a single row of components of said one or more components or aligned over only one empty location on said substrate that may be occupied by a corresponding component of said one or more components.

9. The method of claim 8, wherein said supports are integrally formed with said top wall of said lid.

10. The method of claim 9, wherein said supports divide said vapor chamber into sub-chambers and said supports include through holes interconnecting said sub-chambers.

11. The method of claim 8, wherein said supports are integrally formed with said bottom wall of said lid.

12. The method of claim 11, wherein said supports divide said vapor chamber into sub-chambers and said supports include through holes interconnecting said sub-chambers.

13. The method of claim 1, said lid further including one or more bellows, each bellows of said one or more bellows separate from said top and bottom wall and extending between an inner surface of said top wall and inner surface of said bottom wall within said vapor chamber, each bellows of said one or more bellows aligned over a different and only one component of said one or more components or over only one empty location on said substrate that may be occupied by a corresponding component of said one or more components.

14. The method of claim 1, wherein said package is selected from the group consisting of ball grid array modules, pin grid array modules, land grid array modules and hyper ball grid array (HyperBGA) modules.

15. The method of claim 1, wherein said package is a hyper ball grid array (HyperBGA) module.

16. The method of claim 1, wherein said lid is formed from material selected from the group consisting of aluminum, copper, Invar, gold, silver, nickel, aluminum-silicon carbide, plastics, ceramics and composites.

17. The method of claim 1, wherein said substrate includes material selected from the group consisting of ceramics, fiberglass, polytetrafluoroethylene, and polymers.

18. The method of claim 1, wherein said bottom wall of said lid is formed from a different material than said top wall and said peripheral sidewall of said lid.

19. The method of claim 1, wherein said bottom wall of said lid is formed from a same material as said top wall and said peripheral sidewall of said lid.

20. The method of claim 1, wherein said peripheral lid support is fabricated from a same material as said top wall and said peripheral sidewall of said lid.

* * * * *